(12) United States Patent
Kipp et al.

(10) Patent No.: US 11,486,907 B2
(45) Date of Patent: Nov. 1, 2022

(54) MONITORING DEVICE AND METHOD OF MONITORING AN IMPEDANCE OF A PROTECTIVE CONDUCTOR, AND CHARGING CONTROL UNIT

(71) Applicants: TE Connectivity Germany GmbH, Bensheim (DE); Heidelberger Druckmaschinen AG, Heidelberg (DE)

(72) Inventors: Stefan Kipp, Wiesloch (DE); Gregor Karrasch, Einhausen (DE); Stefan Stross, Dielheim (DE); Stefan Engert, Burstadt (DE)

(73) Assignees: TE Connectivity Germany GmbH, Bensheim (DE); Heidelberger Druckmaschinen AG, Heidelberg (DE)

( * ) Notice: Subject to any disclaimer, the term of this patent is extended or adjusted under 35 U.S.C. 154(b) by 829 days.

(21) Appl. No.: 16/354,806

(22) Filed: Mar. 15, 2019

(65) Prior Publication Data
US 2019/0212370 A1 Jul. 11, 2019

Related U.S. Application Data

(63) Continuation of application No. PCT/EP2017/073317, filed on Sep. 15, 2017.

(51) Int. Cl.
*G01R 17/10* (2006.01)
*G01R 27/18* (2006.01)
(Continued)

(52) U.S. Cl.
CPC ............ *G01R 17/105* (2013.01); *B60L 53/18* (2019.02); *B60L 53/62* (2019.02); *G01R 15/04* (2013.01);
(Continued)

(58) Field of Classification Search
CPC ........ G01R 31/04; G01R 31/52; G01R 31/54; G01R 31/58; G01R 31/2632; G01R 27/18;
(Continued)

(56) References Cited

U.S. PATENT DOCUMENTS 3,995,200 A   11/1976   Stolarczyk
4,412,347 A * 10/1983   Lipcon .................. H04L 12/413
                                              370/445
(Continued)

FOREIGN PATENT DOCUMENTS

DE   4438389 A1   5/1996
EP   1087053 A2   3/2001
(Continued)

OTHER PUBLICATIONS

German Office Action, dated May 4, 2017, 16 pages.
(Continued)

*Primary Examiner* — Richard Isla
*Assistant Examiner* — Johali A Torres Ruiz
(74) *Attorney, Agent, or Firm* — Barley Snyder

(57) ABSTRACT

A monitoring device for monitoring an impedance of a protective conductor. The monitoring device has a first voltage divider for connection to a voltage source including a series connection to a first resistor and a second resistor. The second resistor has a resistance value which corresponds to a threshold value for the impedance of the protective conductor. A second voltage divider includes a series connection to a third resistor and a bridge diode and a connection to the first resistor at a first end of the third resistor and connectable to a second end of the third resistor and to the protective conductor. A measuring device is provided for the detection of a bridge voltage between a first
(Continued)

node and a second node if the impedance of the protective conductor is greater than the value of the second resistor.

16 Claims, 3 Drawing Sheets

(51) Int. Cl.
| | | |
|---|---|---|
| *G01R 17/14* | (2006.01) | |
| *G01R 31/52* | (2020.01) | |
| *G01R 31/54* | (2020.01) | |
| *B60L 53/62* | (2019.01) | |
| *B60L 53/18* | (2019.01) | |
| *G01R 15/04* | (2006.01) | |
| *H02J 7/00* | (2006.01) | |

(52) U.S. Cl.
CPC ............. *G01R 17/14* (2013.01); *G01R 27/18* (2013.01); *G01R 31/52* (2020.01); *G01R 31/54* (2020.01); *H02J 7/008* (2013.01); *H02J 7/0042* (2013.01); *H02J 7/0047* (2013.01)

(58) Field of Classification Search
CPC ......... B60L 53/18; H02J 7/0042; H02J 7/008; H02J 7/0047; Y02T 90/12; Y02T 10/70; Y02T 10/7072; B60Y 2200/91
See application file for complete search history.

(56) References Cited

U.S. PATENT DOCUMENTS

| | | | |
|---|---|---|---|
| 4,510,435 A | 4/1985 | Tanno | |
| 5,822,344 A * | 10/1998 | Benninger | ............... H01S 3/097 |
| | | | 372/38.04 |
| 6,301,133 B1 | 10/2001 | Cuadra et al. | |
| 7,886,857 B2 | 2/2011 | Fujitake | |
| 2016/0121736 A1* | 5/2016 | Jefferies | ................. B60L 53/66 |
| | | | 320/109 |
| 2016/0238648 A1* | 8/2016 | Stechemesser | ........ G01R 31/14 |

FOREIGN PATENT DOCUMENTS

| | | |
|---|---|---|
| EP | 2945240 A1 | 11/2015 |
| GB | 654116 | 6/1951 |
| JP | 5241847 A | 3/1977 |
| JP | 5848871 A | 3/1983 |
| JP | 11 289684 A | 10/1999 |
| JP | 2009296793 A | 12/2009 |
| KR | 10 2001 0110155 A | 12/2001 |

OTHER PUBLICATIONS

PCT Notification, The International Search Report and The Written Opinion of the International Searching Authority, Intl. App. No. PCT/EP2017/073317, dated Dec. 15, 2017, 17 pages.
Abstract of EP 1087053, dated Mar. 28, 2001, 1 page.
Abstract of EP 2945240, dated Nov. 18, 2015, 1 page.
Japanese First Office Action, dated Mar. 31, 2020, 20 pages.
Korean Office Action, dated Apr. 14, 2020, 6 pages.
Final Office Action from the JPO dated Dec. 8, 2020, in Appln. No. 2019-514081, and English translation thereof, 9 pp.

\* cited by examiner

MONITORING DEVICE AND METHOD OF MONITORING AN IMPEDANCE OF A PROTECTIVE CONDUCTOR, AND CHARGING CONTROL UNIT

CROSS-REFERENCE TO RELATED APPLICATIONS

This application claims the priority of PCT International Application No PCT/EP2017/073317 filed on Sep. 15, 2017, which claims priority under 35 U.S.C. § 119 to German Patent Application No. DE102016217712.5 filed on Sep. 16, 2016.

FIELD OF THE INVENTION

The present invention relates to a monitoring device and a method of monitoring an impedance of a protective conductor. The present invention further relates to a charging control unit for the control of a charging process of a battery in a motor vehicle and to a charging cable for the connection of a battery of a motor vehicle with a voltage source, specifically for the charging of an electric vehicle.

BACKGROUND

Electric vehicles can be charged in various charging modes. These differ inter alia with respect (1) to safety devices, (2) communication with the vehicle, and (3) charging capacity. For safety reasons, the majority of vehicle manufacturers opt for mode 3 charging. However, mode 2 charging constitutes a form of charging which is compatible with vehicles, involving a conventional domestic plug-and-socket device. These charging modes are defined as follows in international standard IEC 61851-21:2010. Currently, mode 3 charging is the safest means of charging a vehicle. This operation is completed in charging stations with special charging equipment in accordance with IEC 61851, or "Electrical Vehicle Supply Equipment" (EVSE), i.e., the charging infrastructure. The charging device is installed in the vehicle. In the charging station, the provision of PWM communication, fault current and overcurrent protection, a cut-off facility, and a specific charging socket outlet is stipulated.

Mode 2 charging represents the safest alternative to mode 3 charging, if no charging infrastructure is available. Charging is completed using a conventional domestic plug-and-socket device (e.g., a Schuko or EC plug and socket), with control and protection functions integrated into the charging cable and, in turn, the charging device is installed in the vehicle.

In the case of mode 3 charging, requirements for the charging infrastructure are clearly defined. In mode 2 charging, however, connection is provided by means of a domestic, industrial, or "campsite" plug-and-socket device. The use of standard domestic installations to provide a charging connection for electrical vehicles involves hazards which have not been comprehensively considered in existing solutions. Charging terminals and their feeder lines must be rated for continuous currents of up to 16 A. In practice, however, this rating is not comprehensively ensured. There are still domestic installations with no fault current protection facility and sockets, the feeder line of which is susceptible to hazardous overheating under such continuous loading, as a result of insufficient cross-sectional dimensions. The consequences can be serious. The user must be able to rely upon the fact that the charging process will proceed safely and reliably, as vehicles are frequently charged overnight. Known mode 2 charging cables can monitor various parameters including e.g., the temperature in the Schuko plug on the infrastructure supply side, or make use of a protective conductor, thereby rendering mode 2 charging significantly safer.

For mode 2, IEC standard 61851 stipulates a mobile device for the enhancement of the protection level (SPE-PRCD). In addition, for the setting of capacity and the fulfilment of safety requirements, a device for communication with the vehicle (PWM module) is required. These components are combined in an "In-Cable Control and Protecting Device" (IC-CPD). The IC-CPD, which is permanently integrated in the charging cable, monitors the protective conductor connection and communicates the upper limit for the charging current to the vehicle. In the event of a fault or a power failure, the charging process is immediately interrupted in order to protect the user and the electric vehicle. The intelligent IC-CPD also detects the incorrect wiring of the socket on the infrastructure side and additionally monitors the incoming protective conductor before charging commences.

For the checking of the protective conductor, the PME (protective multiple earthing) resistance between the protective conductor PE and a neutral conductor N in the public grid system is checked against a maximum value. In this case, it must be possible to vary the mains voltage within wide limits, without significantly influencing the evaluation. Moreover, for safety reasons, the evaluation must be executed separately. At present, monitoring devices are available for this purpose, which generate current pulses, and measure the current flowing in the protective conductor. Additionally, circuits are known, in which the pulse width of a measuring current is measured using an optical coupler.

However, known arrangements have a disadvantage, in that they are strongly dependent upon the mains voltage. Moreover, optical coupler circuits are susceptible to significant ageing and temperature drift, such that these factors must be eliminated so as to not impact the measurement result.

There is consequently a requirement for a monitoring device for monitoring an impedance of a protective conductor which eliminates the disadvantages of known solutions and can be produced safely and reliably, but nevertheless cost-effective.

The present invention is based upon the concept of the employment of a modified Wheatstone bridge for monitoring the impedance of the protective conductor. In general, Wheatstone measuring bridges are characterized by high sensitivity, associated with the zero bridge voltage in the balanced state, and by the extensive compensation of stray effects (e.g. temperature influences), associated with the symmetry of the circuit.

SUMMARY

In accordance with the present invention, a monitoring device for monitoring an impedance of a protective conductor has a first input terminal, a second input terminal, a first resistor and a second resistor having a resistance value which corresponds to a threshold value for the impedance of the protective conductor. The monitoring device further has a third resistor, a bridge diode, a first node between the first resistor and the second resistor, and a second node between the third resistor and the bridge diode. A first voltage divider is provided for connection to a voltage source and is connected to the first resistor and the second resistor in a series, and between the first input terminal and the second input terminal. Further, a second voltage divider is provided and is connected in a series to a first end of the third resistor and the bridge diode. Additionally, the second voltage divider is connected to the first end of the third resistor and the first resistor and connected to a second end of the third resistor to the protective conductor. A measuring device is provided for detecting a bridge voltage between the first node and the second node if the impedance of the protective conductor is greater than the value of the second resistor, and is connected between the first node and the second node.

In accordance with the present invention, a method for monitoring an impedance of a protective conductor comprises the steps of: connecting of a first voltage divider with a first external conductor and a second external conductor of a voltage source. The first voltage divider is in a series connection to a first resistor and a second resistor. The second resistor has a resistance value corresponding to a threshold value for the impedance of a protective conductor. Additionally, the method includes the step of connecting a second voltage divider in a series connection to a third resistor and a bridge diode with a first end of the third resistor connecting to the first resistor and with a second end of the third resistor connecting to the protective conductor. Likewise the method includes the step of detecting a bridge voltage between a first node between the first resistor and the second resistor, and a second node between the third resistor and the bridge diode, if the impedance of the protective conductor is greater than the value of the second resistor.

DETAILED DESCRIPTION OF THE EMBODIMENT(S)

Figure 1:
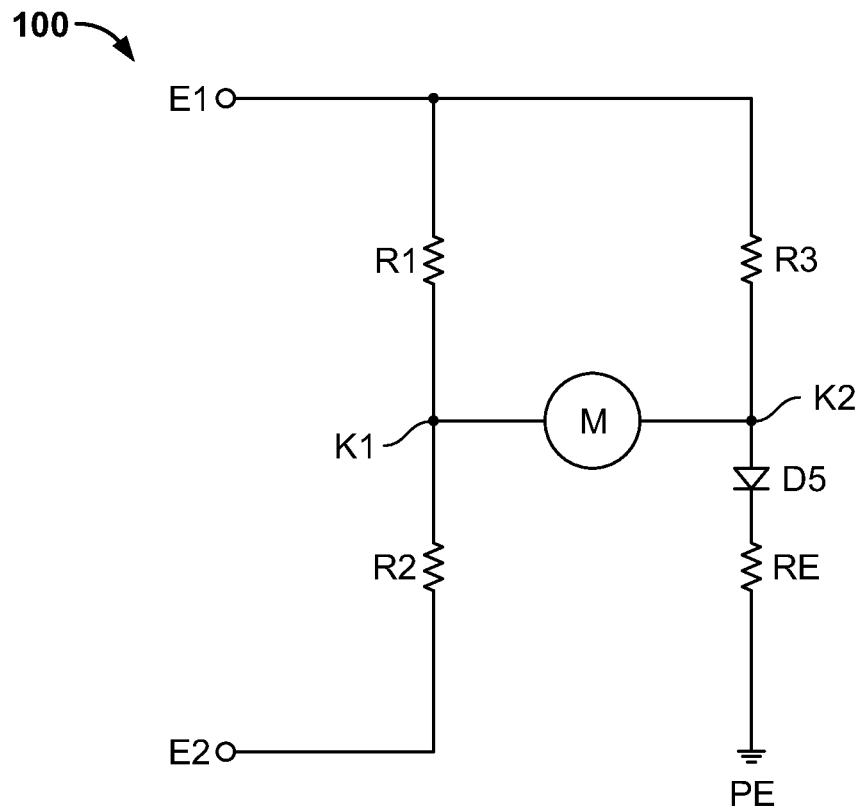
FIG. 1 is a circuit diagram of a monitoring device according to an embodiment of the present invention.

Embodiments of the present disclosure will be described hereinafter in detail with reference to the attached drawings, wherein like reference numerals refer to like elements. The present invention may, however, be embodied in many different forms and should not be construed as being limited to the embodiment set forth herein; rather, these embodiments are provided so that they will convey the concept of the present invention to those skilled in the art.

FIG. 1 shows a monitoring device 100 according to the present invention. The monitoring device 100 monitors the resistance between an input terminal E1 and an input terminal E2 and an impedance RE of a protective conductor PE, and a Wheatstone bridge circuit. The bridge circuit is comprised of two parallel-connected voltage dividers, which are operated by means of the input voltage applied across the input terminals E1 and E2. The first voltage divider comprises a resistor R1 and a resistor R2. The second voltage divider comprises a resistor R3 and a diode D5, as discrete components. The impedance of the protective conductor PE moreover constitutes a virtual resistance element RE.

As is generally known in Wheatstone measuring bridges, a balanced state exists if no voltage is present on the bridging branch between a node K1 and a node K2. A measuring instrument M, as shown in FIG. 1, determines the presence of a voltage in a non-balanced state. The resistor R2 in the first series circuit is selected such that it corresponds to a threshold value of the resistor RE in the second series circuit. The resistors R1 and R3 have an identical resistance value. In this manner, the presence of a measurable voltage between the nodes K1 and K2 indicates that the bridge is not balanced and thus that there is deviation of the resistance RE from the threshold value. As described below, an appropriate circuit design can ensure a measuring signal is only generated on the measuring device M when an excessive value of R2 occurs, i.e., no measuring signal is generated when a value is too low.

If the impedance value RE of the protective conductor PE exceeds the threshold value defined by the reference resistor R2, it can be assumed that a malfunction has occurred. In this case, appropriate measures can be implemented by the measuring means M in order to eliminate a hazardous condition. In the specific case where the monitoring device 100 is in a cable control and protection device (IC-CPD), which is integrated in the charging cable of a vehicle, the charging process can be interrupted and/or a hazard signal can be generated.

If high voltages are present on the input terminals E1, E2, or in the event of a risk that high currents will flow in the measuring bridge, the measuring means M generates an output signal which is galvanically separated from the remainder of the measuring bridge.

Figure 2:
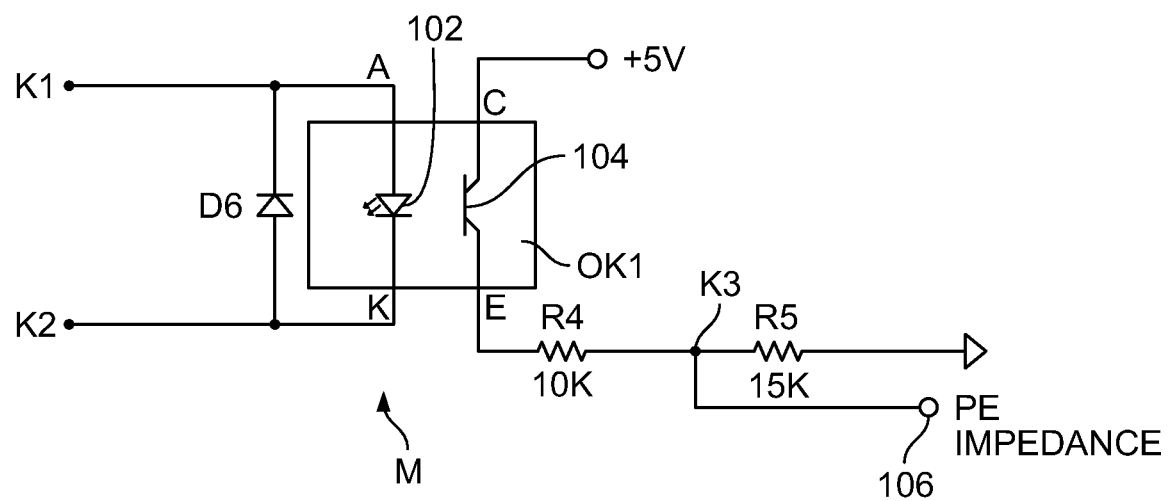
FIG. 2 is a circuit diagram of a measuring device of FIG. 1.

As shown in FIG. 2, an appropriate measuring circuit M can deliver an output signal which is galvanically separated from the nodes K1, K2 if a voltage is present between the nodes K1, K2 creating an imbalance on the bridge. To achieve the signal delivery, the measuring circuit M incorporates an optical coupler OK1. The optical coupler OK1 has an anode terminal A, a cathode terminal K, a collector terminal C, and an emitter terminal E. The anode terminal A is connected to the first node K1 and the cathode terminal K is connected to the second node K2. When the impedance of the protective conductor is greater than the value of the second resistor R2, a signal is present on the emitter terminal E.

Further, the optical coupler OK1 has on its input a light-emitting diode 102 between the anode terminal A and the cathode terminal K. If a voltage is present between the anode terminal A and the cathode terminal K in the forward direction of the light-emitting diode, the diode transmits radiation to a phototransistor 104. As a result, the connection between the collector C and the emitter E of the optical coupler OK1 is made conductive.

The unipolar connection of the optical coupler OK1, ensures that only a voltage which exceeds the threshold value for impedance is evaluated and thereby normal operating conditions, i.e., below the impedance threshold are excluded from evaluation.

A read-out of an output signal (PE impedance), on an output terminal 106, generated in an overshoot event, is provided when the emitter terminal E is connected to a third voltage divider, which incorporates a resistor R4 and a resistor R5 comprising a series circuit, and wherein an output terminal 106 of the monitoring device 100 is connected to a fourth node, which is arranged between the fourth resistor R4 and the fifth resistor R5 and which are connected to ground. The collector terminal C is connected to a DC supply voltage of, for example, +5 V. Thus, if the phototransistor 104 is conductive, the output signal can be read-off on the node K3 (i.e., a fourth node) between the resistors R4 and R5. The output terminal 106 is galvanically separated from the nodes K1 and K2.

Figure 3:
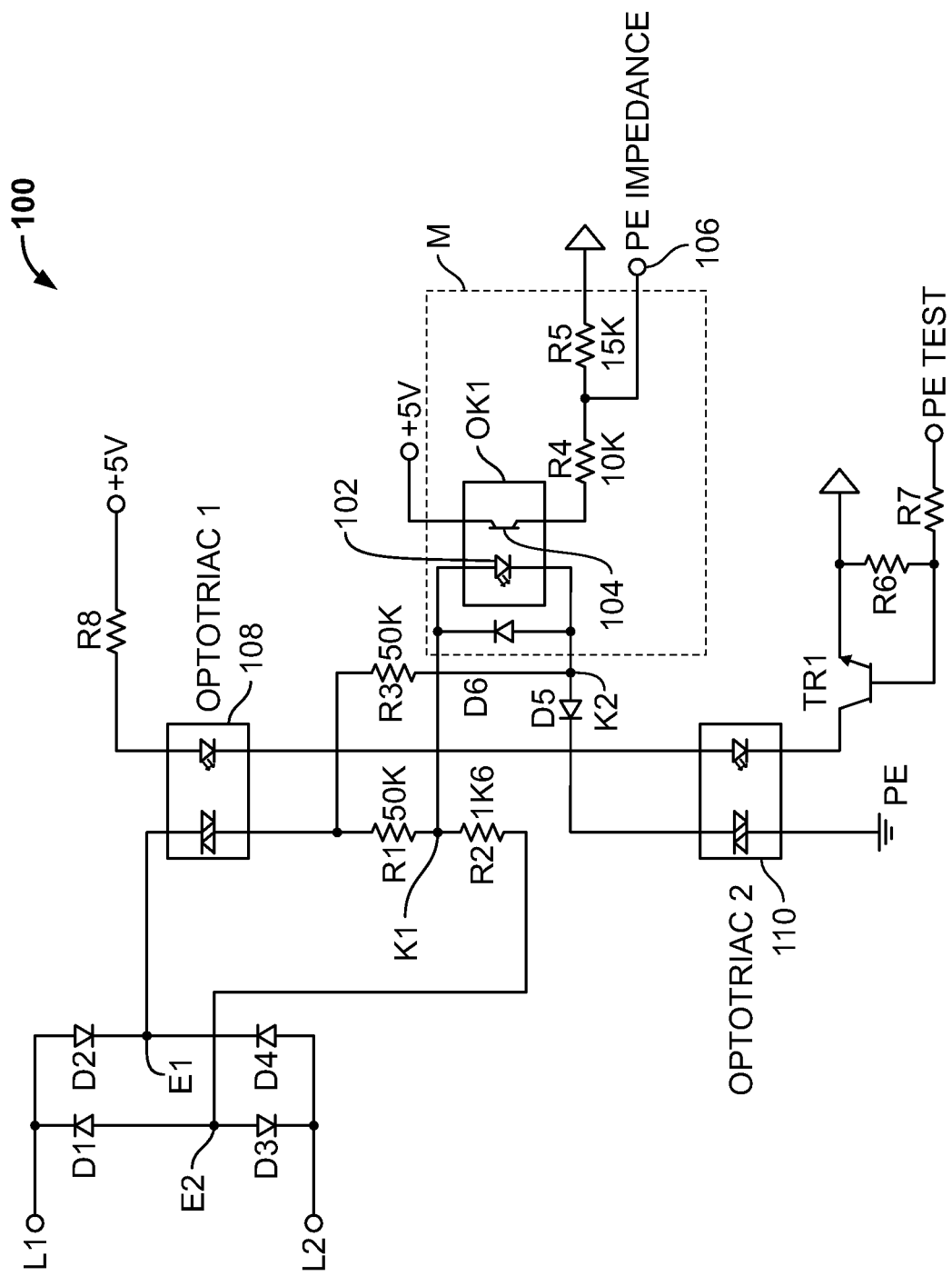
FIG. 3 is a circuit diagram of an embodiment of the monitoring device according to the present invention.

FIG. 3, shows a detailed circuit diagram, of an embodiment of the monitoring device 100. In the shown embodiment, the measuring circuit M is unchanged with respect to FIG. 2. To monitor the impedance of the protective conductor PE as it relates to an external conductor L1, and an external conductor L2 of a voltage source such as a mains, the input terminals E1, E2 of the monitoring device are connected to the external conductors L1, L2 via a full-wave rectifier D1-D4 forming a rectifier bridge circuit (D1, D2, D3, D4) which is arranged between a first L1 and second L2 external conductor of the voltage source and the first E1 and second E2 input terminals. In this arrangement, each of the external conductors L1, L2 can be the neutral conductor. The input voltage of the circuit according to the invention is the rectified mains voltage, such that the phase and neutral conductors can be interchanged, with no resulting influence upon the function of the monitoring device. 100.

In the example embodiment, resistance values of 50 k$\Omega$ have been selected for the resistors R1 and R2, whereas the resistor R2, as a reference value, assumes a value of 1.6 k$\Omega$ in accordance with IEC standard 62752 (version 2016), page 120, FIG. 12 in para 9.7.7.5.

Moreover, the circuit arrangement according to FIG. 3 permits the switch-in of the mimic measuring function for a short time only, such that the current flowing to the protective conductor is switched-in in a temporary manner only. This is primarily advantageous for safety reasons. To this end, a first opto-triac 108 is arranged between the node E1 and the first terminal of the resistor R1. A second opto-triac 110 is arranged between the cathode of the diode D5 and the protective conductor PE such that the first opto-traic 108 and the second opto-triac 110 are controlled by a common control line.

Alternatively, the switching means can comprise a first opto-triac 108 and a second opto-triac 110. The first opto-triac 108 is arranged between the first input terminal E1 and a first main terminal of the second opto-triac 110. A second main terminal of the second opto-triac 110 is connected to the first resistor R1. The first opto-triac 108 and second opto-triac 110 are controllable by means of a common control line.

The simultaneous triggering of the first opto-triac 108 and the second opto-triac 110 can be achieved in a simple manner. To do so the first opto-triac 108 and second opto-triac 110 have an anode terminal A and a cathode terminal K respectively. The anode terminal A of the first opto-triac 108 is connected to a supply voltage and the cathode terminal K of the first opto-triac 108 is connected to the anode terminal A of the second opto-triac 110. Subsequently, the cathode terminal K of the second opto-triac 110 is connected to a reference potential, via a controllable semiconductor switch.

The first opto-triac 108 and the second opto-triac 110, each have two main terminals, between which a current can flow if the triac has been triggered by means of an optical signal from the light-emitting diode associated with the respective triac. The triac remains conductive, until the holding current drops below a minimum threshold. Advantageously, the control circuit of the opto-triac is galvanically isolated from the voltage source to be analyzed.

As shown in FIG. 3, the light-emitting control diodes of the first opto-triac 108 and the second opto-triac 110 are connected in series between a supply voltage of +5 V and the ground potential. A switching transistor TR1, which can be switched to the conductive state from a control terminal PE Test, permits a current flow through the light-emitting control diodes and, therefore, triggers the first opto-triac 108 and the second opto-triac 110. Immediately after the test routine is terminated, the flow of current through the light-emitting diodes is interrupted once more and the first opto-triac 108 and the second opto-triac 110 are no longer conductive. As a result, the monitoring device is no longer actively connected to the voltage source to be tested.

During the test, there is a short-term current flux through the measuring bridge to the protective conductor PE and the light-emitting diode 102 of the optical coupler OK1 initiates a current flux through the resistors R4, R5 of the third voltage divider if the impedance value RE of the protective conductor PE exceeds the threshold value 1.6 k$\Omega$ of the resistor R2.

The switching value of the optical coupler OK1 is variable within extensive limits, independently of the network voltage, and the switching point is very clearly defined. Moreover, the voltage characteristic generated on the output of the optical coupler OK1 is substantially independent of ageing and drift effects. As such, the monitoring device comprises a switching means for the time-limited connection of the monitoring device with a voltage source that is to be monitored.

The arrangement according to the invention, as indicated, can be employed in charging cables for electrically-powered vehicles. In principle, however, the monitoring device can be generally employed for impedance monitoring on other devices or sensors which require such impedance monitoring, even when connected to a supply.

Figure 4:
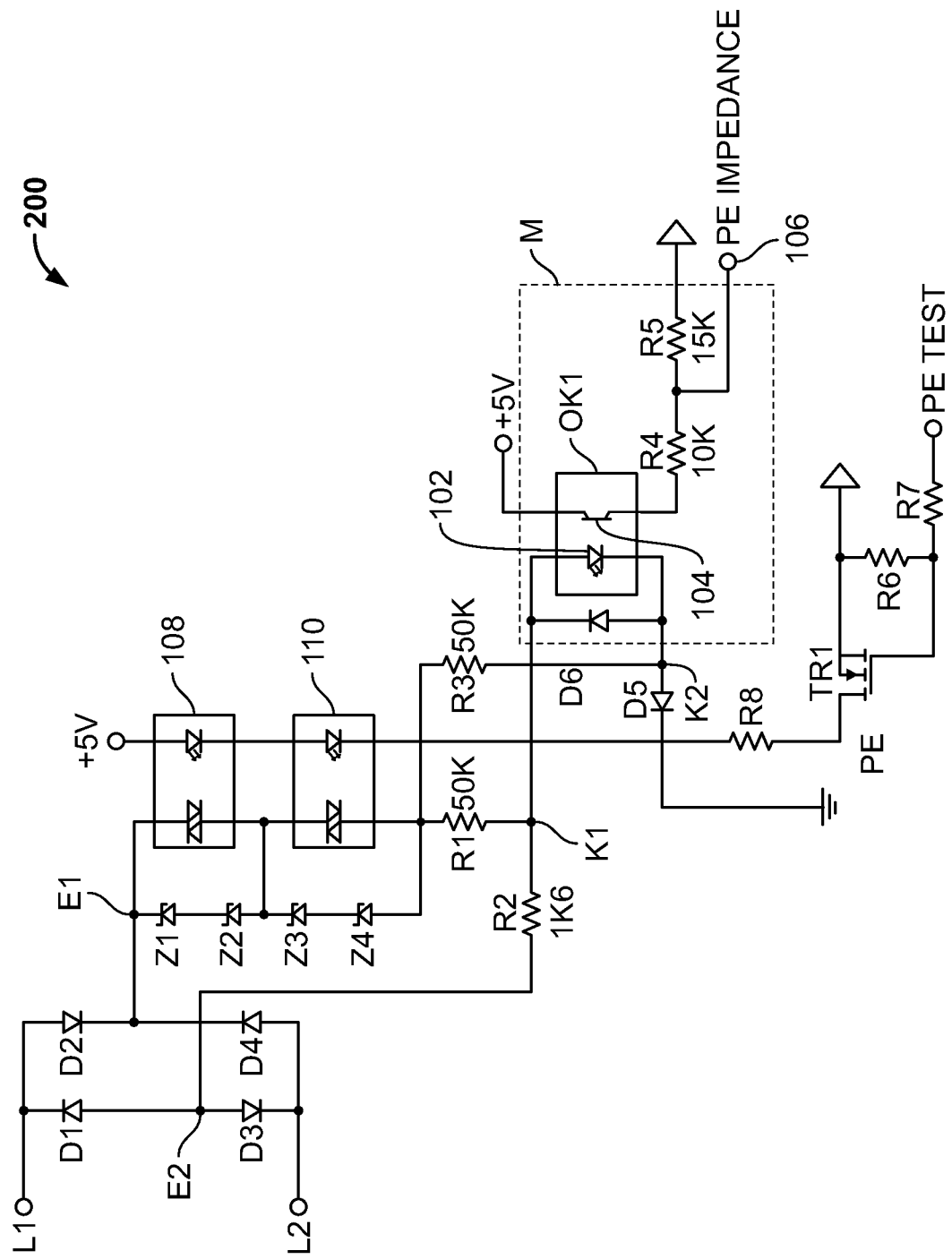
FIG. 4 is a circuit diagram of an embodiment of the monitoring device according to the invention.

FIG. 4 shows an example embodiment of a monitoring device 200 according to the invention. In a distinction from the arrangement represented in FIG. 3, the first opto-triac 108 and the second opto-triac 110 are arranged directly one after the other, up-circuit of the resistors R1 and R3. Moreover, series circuits comprised of two Zener diodes Z1, Z2 and Z3, Z4 are connected in parallel with the main terminals of the first opto-triac 108 and the second opto-triac 110. The function of these Zener diodes is to protect against electrostatic discharges (ESD).

Aside from this modification, the monitoring device 200 functions in a similar fashion as the monitoring device 100, shown in FIG. 3.

The present invention further relates to a charging control unit for the control of a charging process of a battery in a motor vehicle, wherein the charging control unit comprises a monitoring device according to the present invention.

Moreover, the present invention can be used in a charging cable for the connection of a battery of a motor vehicle with a voltage source, wherein the charging cable incorporates a charging control unit with a monitoring device.

The present invention further relates to an associated method for monitoring an impedance of a protective conductor, comprising the following steps:

Connecting of a first voltage divider with a first L1 and second L2 external conductor of a voltage source, wherein the first voltage divider comprises a series connection of a first resistor R1 and a second resistor R2, wherein the second resistor R2 has a resistance value which corresponds to a threshold value for the impedance RE of the protective conductor PE;

Connecting of a second voltage divider, comprising a series connection of a third resistor R3 and a bridge diode D5, with a first end of the third resistor R3 to the first resistor R1, and with a second end to the protective conductor PE;

Detecting of a bridge voltage between a first node K1, which is arranged between the first resistor R1 and the second resistor R2, and a second node K2, which is arranged between the third resistor R3 and the bridge diode D5, if the impedance RE of the protective conductor PE is greater than the value of the second resistor R2.

It should be appreciated for those skilled in this art that the above embodiments are intended to be illustrative and not restrictive. For example, many modifications may be made to the above embodiments by those skilled in this art and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A monitoring device for monitoring an impedance of a protective conductor, comprising:
    a first input terminal;
    a second input terminal;
    a first resistor;
    a second resistor having a resistance value which corresponds to a threshold value for the impedance of the protective conductor;
    a third resistor;
    a bridge diode;
    a first node between the first resistor and the second resistor;
    a second node between the third resistor and the bridge diode;
    a first voltage divider for connection to a voltage source, comprising:
        (a) the first resistor and the second resistor connected in series, and connected
        (b) between the first input terminal and the second input terminal;
    a second voltage divider, comprising:
        (a) the third resistor and the bridge diode connected in series,
        (b) a first end of the third resistor connected to the first,
        (c) a second end of the third resistor connected to the protective conductor; and
    a measuring device:
        (a) for detecting a bridge voltage between the first node and the second node when the impedance of the protective conductor is greater than the resistance value of the second resistor, and
        (b) connected between the first node and the second node.

2. The monitoring device according to claim 1, wherein the measuring device further includes an optical coupler having:
    (a) an anode terminal connected to the first node,
    (b) a cathode terminal connected to the second node,
    (c) a collector terminal, and
    (d) an emitter terminal,
    whereby a signal is present on the emitter terminal if the impedance of the protective conductor is greater than the resistance value of the second resistor.

3. The monitoring device according to claim 2:
    (a) further including:
        (1) a third voltage divider that includes a series circuit of a fourth resistor and a fifth resistor,
        (2) a third node between the fourth resistor and the fifth resistor, and
        (3) an output terminal between the fourth resistor and the fifth resister connected to the fourth node, and
    (b) wherein the emitter terminal of the optical coupler is connected to the third voltage divider.

4. The monitoring device according to claim 3, further including:
    (a) a first external conductor and a second external conductor of the voltage source and the first input terminal and second input terminal, and
    (b) a rectifier bridge circuit between the first external conductor and second external conductor of the voltage source and the first input terminal and second input terminal.

5. The monitoring device according to claim 4, further including a switching means for time-limited connection of the monitoring device with the voltage source.

6. The monitoring device according to claim 5, wherein the switching means further includes:
    (a) a first opto-triac between the first input terminal and the first resistor; and
    (b) a second opto-triac between the bridge diode and the protective conductor,
    whereby the first opto-triac and the second opto-triac are controllable by a common control line.

7. The monitoring device according to claim 5, wherein the switching means further includes:
    (a) a first opto-triac; and
    (b) a second opto-triac, having:
        (1) a first main terminal with the first opto-triac between the first main terminal and the first input terminal, and
        (2) a second main terminal connected to the first resistor,
    whereby the first opto-triac and the second opto-triac are controllable by a common control line.

8. The monitoring device according to claim 7, wherein the first opto-triac and the second opto-triac each have an anode terminal and a cathode terminal with:
    (a) the anode terminal of the first opto-triac connected to a supply voltage,
    (b) the cathode terminal of the first opto-triac connected to the anode terminal of the second opto-triac, and
    (c) the cathode terminal of the second opto-triac connected to a reference potential, via a controllable semiconductor switch.

9. The monitoring device according to claim 1 further includes a charging control unit for the control of a charging process of a battery in a motor vehicle.

10. The monitoring device of claim 9:
    (a) further including a charging cable for the connection of a battery of a motor vehicle with a voltage source, and
    (b) wherein the charging cable incorporates the charging control unit.

11. A method for monitoring an impedance of a protective conductor, comprising the steps of:
    connecting a first voltage divider with a first external conductor and a second external conductor of a voltage source, the first voltage divider includes a first resistor and a second resistor in a series connection, the second resistor having a resistance value corresponding to a threshold value for the impedance of the protective conductor;

connecting a second voltage divider including a third resistor and a bridge diode in a series connection, with a first end of the third resistor connecting to the first resistor and with a second end of the third resistor connecting to the protective conductor;

detecting a bridge voltage between a first node between the first resistor and the second resistor and a second node between the third resistor and the bridge diode, when the impedance of the protective conductor is greater than the resistance value of the second resistor.

12. The method according to claim 11, further comprising the step of rectifying a voltage of the first external conductor and the second external conductor by means of a rectifier bridge circuit.

13. The method according to claim 11, further comprising the step of: monitoring the impedance of the protective conductor only during short test intervals.

14. The method according to claim 13, further comprising the step of generating a warning signal if the impedance of the protective conductor is greater than the resistance value of the second resistor.

15. The method according to claim 13, further comprising the step of interrupting a battery charging process if the impedance of the protective conductor is greater than the resistance value of the second resistor.

16. The method according to claim 11, further comprising the steps of:
(a) constituting the input signal of an optical coupler by the bridge voltage, and
(b) delivering an output signal on an emitter terminal of the optical coupler if the impedance of the protective conductor is greater than the resistance value of the second resistor.

\* \* \* \* \*